(12) United States Patent
Toraille et al.

(10) Patent No.: US 9,778,753 B2
(45) Date of Patent: Oct. 3, 2017

(54) KEYBOARD WITH IMPROVED RELIABILITY

(71) Applicant: THALES, Courbevoie (FR)

(72) Inventors: Vincent Toraille, Vendome (FR); Jacques Bellon, Vendome (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/971,966

(22) Filed: Dec. 16, 2015

(65) Prior Publication Data

US 2016/0179212 A1    Jun. 23, 2016

(30) Foreign Application Priority Data

Dec. 17, 2014 (FR) ...................... 14 02876

(51) Int. Cl.
*G09G 5/00* (2006.01)
*G06F 3/02* (2006.01)
*H03K 17/969* (2006.01)
*G06F 3/023* (2006.01)

(52) U.S. Cl.
CPC ............ *G06F 3/0202* (2013.01); *G06F 3/023* (2013.01); *H03K 17/969* (2013.01)

(58) Field of Classification Search
CPC .. G09G 5/00; G09G 5/08; G06F 3/033; G06F 3/02; G06F 3/041; G06F 3/045
See application file for complete search history.

(56) References Cited

U.S. PATENT DOCUMENTS

| 4,542,375 | A | 9/1985 | Alles et al. |
| 5,975,711 | A | 11/1999 | Parker et al. |
| 6,741,189 | B1 | 5/2004 | Gibbons et al. |
| 2003/0052257 | A1 | 3/2003 | Sumriddetchkajorn |
| 2003/0193421 | A1* | 10/2003 | Maatta ............... H03K 17/9638 341/31 |
| 2010/0156801 | A1* | 6/2010 | Yurochko ............. G06F 3/0202 345/170 |
| 2010/0295792 | A1* | 11/2010 | Saarikko .............. G02B 6/0043 345/169 |
| 2010/0326803 | A1 | 12/2010 | Um |

(Continued)

FOREIGN PATENT DOCUMENTS

DE   198 56 008 A1   6/2000
FR   2 521 330 A1    8/1983

(Continued)

*Primary Examiner* — Pegeman Karimi
(74) *Attorney, Agent, or Firm* — Baker & Hostetler LLP

(57) ABSTRACT

A keyboard comprises: several keys operated by a user, the operating forming, for each key, a signal representative, a flat waveguide having a first and second external face for a wave of light to reflect between the faces, the first face of the waveguide comprising an altered zone so part of the wave leaves the waveguide via the altered zone to backlight the keyboard, for each key a plunger moved between two positions, one in contact with the first face and the other distant from the first face, contact of the plunger with the first face causing the reflection of the wave in the waveguide to be locally frustrated, associated with each of the plungers, a sensor arranged in an empty space delimited by the second face, the sensor associated with the plunger and configured to detect the frustration of the reflection, the sensor forming the representative signal.

9 Claims, 2 Drawing Sheets

(56) References Cited

U.S. PATENT DOCUMENTS

| | | | | |
|---|---|---|---|---|
| 2012/0080297 A1* | 4/2012 | Takeuchi | ............. | G06F 3/0202 200/310 |
| 2014/0055366 A1* | 2/2014 | Ouyang | ............... | G02B 6/0081 345/170 |
| 2014/0166457 A1* | 6/2014 | Chen | ..................... | H01H 13/83 200/5 A |

FOREIGN PATENT DOCUMENTS

| | | |
|---|---|---|
| GB | 2 074 428 A | 10/1981 |
| GB | 2 409 515 A | 6/2005 |
| JP | 2004-214059 A | 7/2004 |
| WO | 2005/125011 A1 | 12/2005 |

\* cited by examiner

KEYBOARD WITH IMPROVED RELIABILITY

CROSS-REFERENCE TO RELATED APPLICATIONS

This application claims priority to foreign French patent application No. FR 1402876, filed on Dec. 17, 2014, the disclosure of which is incorporated by reference in its entirety.

FIELD OF THE INVENTION

The invention relates to a keyboard the reliability of which is improved. Keyboards are present in numerous items of electronic equipment. They are used so that a user can input data.

BACKGROUND

Known keyboards comprise keys intended to be operated by a user. Operation of a key leads to operation of a switch making it possible to make an electrical connection between two points so that an electrical signal can be made to pass or prevent it from passing according to the pressing of the key. The switch for example comprises a metal dome secured to a printed circuit. The dome is intended to collapse under the effect of the pressing of the key. In collapsing, the dome creates an electrical contact on the printed circuit.

This type of keyboard imposes numerous restrictions on the equipment. First of all, the life of the keyboard is limited by the mechanics of the keys and of the associated switches. The moving parts and their fixings may reach their fatigue limit. In order to achieve a desired life, certain components may need to be overengineered, leading to additional costs and potentially hampering attempts at miniaturization.

SUMMARY OF THE INVENTION

The invention provides a solution to this problem by proposing a keyboard that is far simpler to create. The keyboard is created around an optical waveguide performing numerous functions such as notably that of decoupling the movement of the key from the formation of a signal representative of the movement of the key.

To that end, the subject of the invention is a keyboard comprising:
  several keys intended to be operated by a user, the operating of the keys making it possible to form, for each key, a signal representative of the operation thereof,
  a flat waveguide having a first and a second external face, it being possible for a wave to reflect totally between the two faces, the first face of the waveguide comprising an altered zone altered so that part of the wave leaves the waveguide via the altered zone in order to backlight the keyboard,
  associated with each key a plunger that can be moved by the corresponding key between two positions, one in contact with the first face of the waveguide and the other distant from the first face, contact of the plunger with the first face causing the reflection of the wave in the waveguide to be locally frustrated,
  associated with each of the plungers, a sensor arranged in an empty space delimited by the second face, the sensor being configured to detect the frustration of the reflection, the sensor forming the respective representative signal.

The presence of an optical waveguide is of course used to form the signals representative of the movement of the keys. The waveguide also allows the keyboard to be backlit. It also allows the keys to be separated from the sensors or, more exactly, allows the two parts of the keyboard:
  the mechanical parts of the keyboard that move when the keys are operated,
  the part of the keyboard that forms the signals representative of the movement of the keys
  to be physically isolated.

This physical isolation allows the part that deals with the formation of the signals to be protected from dust or liquid with which the keys may become contaminated.

Moreover, protecting the keyboards from electromagnetic perturbations can present problems. Specifically, in conventional keyboards, the electrical signals passing through the switches may become perturbed or may perturb other equipment. The presence of the moving parts of the keyboards may make it difficult to create shielding screens that allow the signals to be isolated from the external environment. The presence of the waveguide allows this problem to be resolved with ease. To this end, the keyboard advantageously comprises an electrical shielding screen arranged on one of the faces of the waveguide, the shielding screen being transparent to the wave propagated in the waveguide.

Advantageously, the keyboard comprises at least one cover to protect the sensor from a parasitic wave not originating from the frustration brought about by the contact of the plunger associated with the sensor.

The cover may be formed by a mask that is opaque to the wave propagating in the waveguide, the mask covering the second face except for a hole centered facing a zone intended to receive contact from the plunger on the first face.

The altered zone may focus the light extracted via the first face around a direction perpendicular to the plane of the waveguide.

The keyboard may comprise a first and a second source of wave propagating in the waveguide and each source emitting in a wavelength band, the two bands being distinct. The sensor is then configured to detect a wave in the band of the first source and the band of the second source is used to exit the waveguide via the altered zone.

Advantageously, the keyboard comprises a light source controlled by the representative signal and allowing information to be fed back to the user as a function of contact of the plunger with the first face of the waveguide.

The light source allowing the feedback of information may be arranged in such a way as to emit light perpendicular to the waveguide and crossing it.

The light source allowing the feedback of information may emit in a wavelength band distinct from that for which the sensor is configured.

BRIEF DESCRIPTION OF THE DRAWINGS

The invention will be better understood and other advantages will become apparent from reading the detailed description of one embodiment given by way of example, which description is illustrated by the attached drawing in which.

For the sake of clarity, the same elements will bear the same references in the various figures.

DETAILED DESCRIPTION

Figure 1:
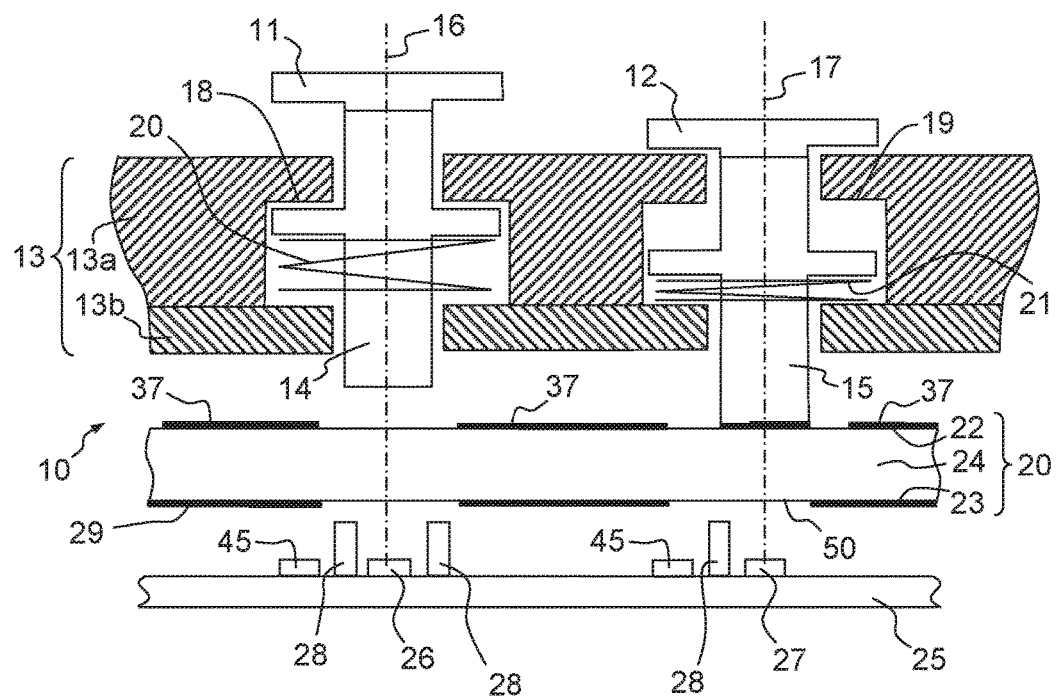
FIG. 1 schematically in section depicts one example of a keyboard according to the invention.

FIG. 1 depicts a keyboard 10 comprising two keys 11 and 12. In practice, a keyboard according to the invention may comprise a greater number of keys, as is the case for example with a keyboard allowing the input of alphanumeric characters. Conversely, the invention may be implemented on a keyboard having just one key.

Returning to the example depicted, the keys 11 and 12 are able to move translationally with respect to a support 13 which is, for example, flat and fixed to a piece of electronic equipment. Secured to each key 11 and 12, a plunger, respectively 14 and 15, follows the translational movement of the key concerned. In practice, the key and the plunger associated with it may be formed by the same mechanical component or by two distinct mechanical components joined together. However, it is possible to make a distinction between the function of the key which is to be pressed by a user, and the function of the plunger which is to transmit this pressure. The plungers 14 and 15 may each move translationally along an axis 16 and 17 respectively, these axes being mutually parallel and perpendicular to the support 13. In FIG. 1, the axes 16 and 17 are depicted as vertical and the movement of the keys 11 and 12 is downward along their respective axis. The movement of each of the keys 11 and 12 is limited upward by an end stop 18 and 19 respectively, formed in the support 13. Each of the plungers 14 and 15 bears against its respective end. A return spring, 20 and 21 respectively, may push the plunger back towards its respective end stop. In this position, pressing against its end stop, the key and its plunger are in a rest position, namely a position not activated by a user. Conversely, when the user presses on one of the keys 11 or 12, by means of a vertical pressure, the corresponding plunger ceases to bear against its end stop and depresses the associated return spring. The support 13 may be formed by two mechanical parts 13a and 13b formed together in order to allow the plunger and the corresponding spring to be fitted.

In the example depicted, the return spring 20 or 21 applies to the corresponding plunger 14 or 15 a force that is proportional to its movement. It is possible to provide the user with tactile feedback that is not proportional, for example having a force/displacement curve that exhibits a maximum. This type of curve may for example be obtained by means of a "hard point" in the movement of the plunger. This hard point may comprise a cam produced on the plunger. A cam follower such as a ball for example, able to move horizontally with respect to the support 13 is kept bearing against the cam by means of a spring. The shape of the cam defines the force/displacement curve desired.

The keyboard 10 comprises a flat waveguide 20 substantially perpendicular to the axes 16 and 17. The waveguide 20 makes it possible to guide an electromagnetic wave, such as a wave of light for example, in a central layer 24 bounded by two external faces 22 and 23. The refractive index of the central layer 24 is higher than that of the medium in which the waveguide 20 is placed, such as air in particular. Total reflection of the wave propagated in the central layer 24 off the two external faces 22 and 23 is thus obtained. The waveguide 20 is, for example, made of glass or of polymethylmethacrylate, often abbreviated to PMMA.

The plunger 14 or 15 can be moved between two positions: one in contact with the face 22 and the other distant from the face 22 and resting against its end 18 or 19. In FIG. 1, the plunger 14 is depicted distant from the face 22 and the plunger 15 is depicted in contact with the face 22. Contact of the plunger 15 with the face 22 locally frustrates the reflection of the wave in the guide 20. This frustration leads to a back-scattering of the wave which crosses the guide 20 at right angles to the plane thereof. Part of the wave therefore passes through the face 23 when the plunger 15 is in contact with the face 22. In the absence of contact between the plunger and the face 22 there is no frustration and the wave is totally reflected off the two faces 22 and 23. By arranging, under the waveguide 20, a sensor under each of the plungers 14 and 15, it is possible to detect the frustration and therefore detect contact of the relevant plunger with the face 22. A plunger of which the refractice index is higher than that of air frustrates this reflection. For example, a silicone-based plunger white in color performs this function well. It has the advantage of making good contact with the face 22 while in particular avoiding trapping bubbles of air between the plunger and the face 22.

The keyboard 10 comprises a printed circuit 25 arranged parallel to the waveguide 20 on the side of the face 23. The printed circuit bears a sensor 26 arranged facing the plunger 14 on the axis 16 and a sensor 27 arranged facing the plunger 15 on the axis 17. The sensors 26 and 27 are, for example, photodiodes sensitive to the wave of light propagated in the waveguide 20. The sensors 26 and 27 form a signal representative of the pressing of the respective keys 11 and 12 by a user. For photodiodes the representative signal is electrical and can be processed by other components arranged on the printed circuit 25. The current coming from a photodiode can be processed using a current-voltage converter followed by an operational amplifier that compares the voltage generated by the converter against a threshold. A binary signal is available at the output of the operational amplifier and represents the detection of a pressing of the key in the case of one of the levels, and the absence of pressing in the case of the other binary level. By way of alternative, other types of sensor may be used within the context of the invention, such as a sensor that delivers an optical signal for example.

Figure 2:
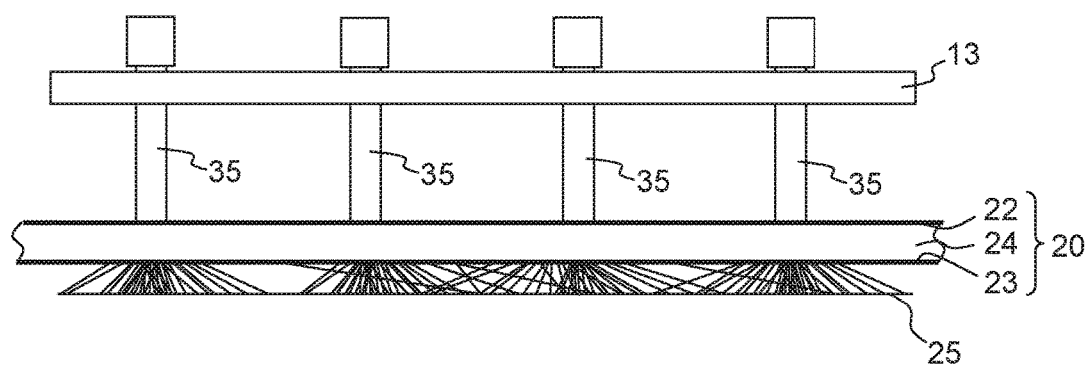
FIG. 2 depicts a simulation of a back-scattered wave for pressure applied simultaneously to several keys of the keyboard.

FIG. 2 depicts a simulation of the wave back-scattered for simultaneous pressing of four closely spaced keys of the keyboard 10. The wave backscattered when a plunger makes contact with the face 22 is emitted around a direction perpendicular to the plane of the light guide 20. The various plungers are identified as 35 in FIG. 2. The intensity of the backscattered wave is at a maximum in the direction perpendicular to the plane of the waveguide 20 and decreases for directions deviating from the perpendicular direction. In FIG. 2, lines represent the presence of a back-scattered wave. The more closely spaced the lines, the greater the intensity of the backscattered wave. In order to prevent the sensors 26 and 27 from detecting a wave backscattered by a nearby plunger not associated with it, the keyboard 20 comprises at least one cover to protect the sensor 26 or 27 from a parasitic wave that does not originate from the frustration brought about by contact of the plunger associated with the sensor. Several alternative forms of cover are depicted in FIG. 1. The cover may be formed by a wall 28 arranged on the printed circuit 25 between the sensors 26 and 27. It is also possible to provide a wall surrounding each of the sensors 26 and 27. The cover may also be formed by an opaque mask 29 arranged on the face 23 preventing an oblique backscattered wave from leaving the waveguide 20. The mask may cover the entirety of the face 23 with the exception of holes, for example circular holes, centered on the axes 16 and 17 or, in other words, with the exception of a hole if the keyboard comprises just one key or of several holes each one centered facing a zone intended to receive contact of one of the plungers 14 or 15 on the first face 22.

Advantageously, the waveguide 20 can be used to backlight the keyboard 10. This lighting may be used to display images, text zones or icons present between the keys on the support 13. These images act for example as indicators for the various keys of the keyboard 10. Light extracted from the waveguide 20 passes through the support 13 which is transparent or at least partially transparent. It is possible to allow the light to pass through the support 13 only in zones in which the images are present. Outside of these image zones, the support may be covered with opaque, for example black, paint. The support may also have diffuser properties so as to even out the light passing through it. It is also possible to backlight the keys of the keyboard 10. In order to extract light from the waveguide 20, the face 22 comprises one or more altered zones 37 altered so that part of the wave propagating in the guide exits the waveguide 20 via the altered zone or zones 37.

The altered zones may be produced using a diffusing paint applied to the face 22. Advantageously, the altered zones are configured to focus the light extracted via the face 22 around a direction perpendicular to the plane of the waveguide 20. The focusing is, for example, performed by a micro prism film, well known by its English-language abbreviation BEF which stands for Brightness Enhancement Film. Focusing makes it possible to prevent the light extracted for the backlighting of the keyboard 10 from perturbing the detection of the frustration by the plungers.

Figure 3:
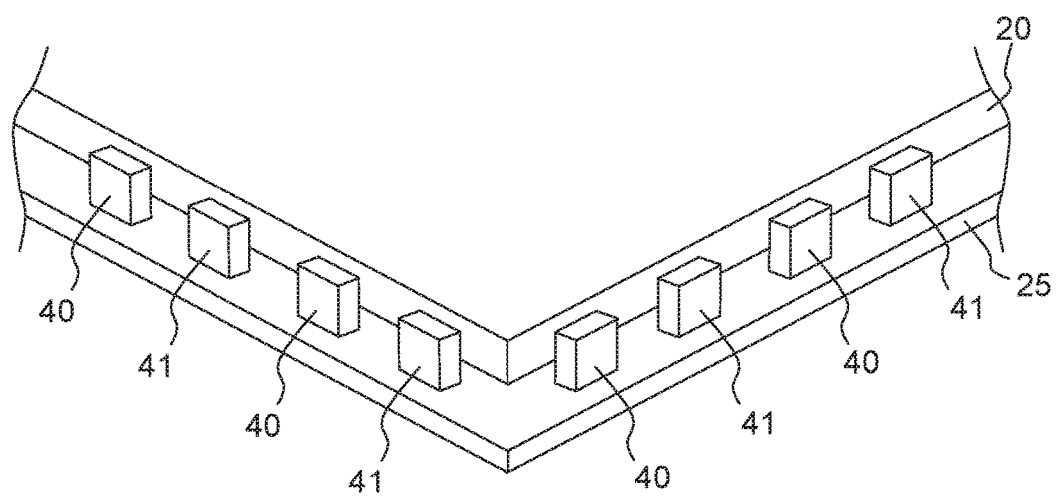
FIG. 3 schematically depicts the keyboard in perspective.

FIG. 3 schematically depicts a keyboard 10 in perspective. This figure depicts sources allowing the wave propagated in the waveguide 20 to be generated. The keyboard 10 is flat and extends for example over a parallelepipedal surface. The waveguide 20 extends substantially over the entire surface of the keyboard 10. The sources for waves propagating through the waveguide 20 may be formed of light emitting diodes arranged on the periphery of the waveguide 20 and illuminating it via its edge face. The sources may all be identical and may all emit only on the same wavelength.

Alternatively, it is possible to differentiate the sources according to their use. More specifically, sources with different wavelengths can be used for detecting the pressing by the plungers and for the backlighting of the keyboard 10. For example, diodes emitting in an infrared band may be used to detect the pressing of the plungers and diodes emitting in a visible wavelength band may be used for the backlighting. The two types of diodes are, for example, alternated around the periphery of the waveguide. The proportion of diodes emitting in each of the bands is adapted to suit the requirement. Thus, the risk of interference between the backlighting and the detection of the pressing by the plungers is reduced. The sensors 26 and 27 are also tailored to detecting the wavelength band selected for the diodes intended to detect the pressing of the plungers. In FIG. 3, diodes 40 emit in the infrared and diodes 41 emit in a visible waveband. The altered zones 37 may have a special treatment to limit the transmission of the wavelength chosen for the diodes intended to detect the pressing of the plungers.

The presence of the waveguide may advantageously be put to use to allow information to be fed back to the user according to contact of one of the plungers with the face 22. To this end, the keyboard comprises a light source 45 controlled by the representative signal originating from the corresponding sensor. This light source 45 is activated according to the pressing by the user of the corresponding key. The feedback of information may be direct, the light source 45 may be active only when there is pressure. The feedback of information may be indirect, for example when a single-acting key is used to control relay. The light source 45 is activated upon a first pressing of the key activating the relay, and deactivated on a subsequent pressing, deactivating the relay.

The light source 45 may be arranged in such a way as to emit in the waveguide 20. The source is therefore arranged at the periphery of the waveguide 20 like the sources 40 and 41. Alternatively, the light source 45 is arranged in such a way as to emit light perpendicular to the waveguide 20 and crossing it. This alternative is well suited to a keyboard comprising several keys and for which feedback of a distinct nature is required for each of the keys. The light source 45 is, for example, formed of one or more light emitting diodes arranged on the printed circuit 25 near the sensor corresponding to the key for which the feedback of information is desired. The wall 28 may separate the light source 45 from the corresponding sensor. Alternatively or in addition, like with the segregation between the backlighting and the detection of the pressing, the sensor may be insensitive to the light emitted by the source 45. Likewise, it is possible to differentiate the color of the backlighting from that of the information feedback. For example, the sensor may operate in the infrared, the backlighting in the red and the feedback of information in the green. It is possible to provide several different colors for feeding back different information, in the case of a keyboard 10 having several keys, or in the case of one and the same key depending on how it is used.

A keyboard according to the invention makes it possible to separate the mechanical action on the key from the detection of this mechanical action. Physically, this separation is achieved by the waveguide 20. This physical separation can be put to use for electromagnetically isolating the keys of the keyboard 10 and the electric signals deflected by the keyboard according to the pressing of the keys. For this purpose, the keyboard 10 comprises an electrical shielding screen 50 arranged on one of the faces of the waveguide, the shielding screen being transparent to the wave (or waves) propagated in the waveguide 20 and, where appropriate, transparent to the light used for the feedback of commands. The shielding screen is, for example, achieved by means of a transparent conducting electrode arranged on one of the faces 22 and 23. This electrode is, for example, made of tin-doped indium oxide, well known by its abbreviation ITO which stands for indium tin oxide. Other technologies may be used to form the shielding screen 50, such as, for example, the use of a transparent film incorporating a conductive mesh. This type of film is known as a micromesh film. The shielding screen 50 covers the entire surface of the waveguide 20 and is connected to a ground potential of the keyboard, for example via the printed circuit 25.

The invention claimed is:

1. A keyboard comprising:
   a plurality of keys configured to be operated by a user;
   a flat waveguide having a first external face and a second external face, the flat waveguide configured to reflect a wave between the first and second faces, the first face comprising an altered zone configured to reflect a portion of the wave to backlight the keyboard;
   a plunger associated with each key and configured to be moved by the corresponding key between first and second positions, the first position being in contact with the first face of the waveguide and the second position being distant from the first face, wherein the first position of the plunger is configured to cause the reflection of the wave in the waveguide to be locally frustrated; and a sensor associated with each of the plungers, the sensor being arranged in an empty space delimited by the second face and spaced from the associated plunger and the waveguide, the sensor being configured to detect the wave and the frustration of the reflection and to generate a signal.

2. The keyboard according to claim 1, further comprising an electrical shielding screen arranged on one of the first and second faces of the waveguide, the shielding screen being transparent to the wave propagated in the waveguide.

3. The keyboard according to claim 1, further comprising at least one cover configured to protect each of the sensors from a parasitic wave not originating from the frustration brought about by the contact of the plunger associated with the sensor.

4. The keyboard according to claim 3, wherein the cover includes is a mask that is opaque to the wave propagating in the waveguide, the mask covering the second face except for a hole centered facing a zone intended to receive contact from the plunger on the first face.

5. The keyboard according to claim 1, wherein the altered zone focuses the light reflected by the first face around a direction perpendicular to a plane of the waveguide.

6. The keyboard according to claim 1, further comprising:
a first source of the wave propagating in the waveguide; and
a second source of the wave propagating in the waveguide, and
wherein each of the first and second sources is configured to emit in a distinct wavelength band, and the sensor is configured to detect a wave in the band of the first source, and the band of the second source exits the waveguide via the altered zone.

7. The keyboard claim 1, further comprising a light source controlled by the signal and configured to emit light when the plunger is in the first position.

8. The keyboard according to claim 7, wherein the light source is configured to emit light perpendicular to the waveguide, such that the light crosses the waveguide.

9. The keyboard according to claim 7, wherein the light source is configured to emit in a wavelength band distinct from a wavelength band that the sensor is configured detect.

* * * * *

UNITED STATES PATENT AND TRADEMARK OFFICE
CERTIFICATE OF CORRECTION

PATENT NO. : 9,778,753 B2  
APPLICATION NO. : 14/971966  
DATED : October 3, 2017  
INVENTOR(S) : Vincent Toraille et al.

Page 1 of 1

It is certified that error appears in the above-identified patent and that said Letters Patent is hereby corrected as shown below:

In the Claims

In Line 24, Column 7 in Claim 4, "includes is a mask" should be --includes a mask--.

Signed and Sealed this  
Seventh Day of November, 2017

Joseph Matal  
*Performing the Functions and Duties of the*  
*Under Secretary of Commerce for Intellectual Property and*  
*Director of the United States Patent and Trademark Office*